United States Patent
Wang et al.

[11] Patent Number: 5,818,082
[45] Date of Patent: *Oct. 6, 1998

[54] E²PROM DEVICE HAVING ERASE GATE IN OXIDE ISOLATION REGION IN SHALLOW TRENCH AND METHOD OF MANUFACTURE THEREOF

[75] Inventors: Hsingya Arthur Wang, Saratoga; Jein-Chen Young, Milpitas; Darlene Hamilton, San Jose, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 610,688
[22] Filed: Mar. 4, 1996
[51] Int. Cl.⁶ .................................................. H01L 29/78
[52] U.S. Cl. ................................................ 257/321
[58] Field of Search .................. 257/320, 321, 257/315–319; 365/185.29, 185.3, 185.33; 437/43, 42, 5-2, 978, 985

[56] References Cited

U.S. PATENT DOCUMENTS

| | | |
|---|---|---|
| 4,334,292 | 6/1982 | Kotecha ................................. 257/321 |
| 4,561,004 | 12/1985 | Kuo et al. ............................. 257/321 |
| 4,571,705 | 2/1986 | Wada ..................................... 257/321 |
| 4,630,087 | 12/1986 | Momodomi ............................ 257/320 |
| 5,126,809 | 6/1992 | Hirai ..................................... 357/23.5 |
| 5,229,632 | 7/1993 | Yoshikawa ............................ 257/320 |
| 5,512,505 | 4/1996 | Yuan et al. ............................ 437/43 |

FOREIGN PATENT DOCUMENTS

| | | |
|---|---|---|
| 0411573A2 | 2/1991 | European Pat. Off. . |
| 0416574A2 | 3/1991 | European Pat. Off. . |
| 0 228 761 B1 | 7/1992 | European Pat. Off. ........ H01L 29/78 |
| 0534676A2 | 3/1993 | European Pat. Off. . |
| 2-218168 A | 8/1990 | Japan . |

*Primary Examiner*—John H. Wolff
*Attorney, Agent, or Firm*—Skjerven, Morrill, MacPherson, Franklin & Friel LLP; Edward C. Kwok

[57] ABSTRACT

An E²PROM device includes a semiconductor body having source and drain regions and a channel region, with a gate oxide over the channel region and a floating gate over the gate oxide. An oxide isolation region contains a doped polysilicon erase gate, so that erasing of the device takes place by electron flow from the floating gate to the erase gate through a thin oxide portion of the oxide isolation region, at a position spaced from the gate oxide. The inclusion of the erase gate in the oxide isolation region results in smaller overall device size than previously achieved.

8 Claims, 2 Drawing Sheets

E²PROM DEVICE HAVING ERASE GATE IN OXIDE ISOLATION REGION IN SHALLOW TRENCH AND METHOD OF MANUFACTURE THEREOF

FIELD OF THE INVENTION

This invention relates to electrically erasable programmable read only memory (E²PROM) devices and in particular to an improved E²PROM structure and method of fabrication thereof which provides high efficiency of operation.

DESCRIPTION OF THE PRIOR ART

Shown in FIG. 1 is a typical prior art E²PROM device 100, which allows its contents to be electrically programmed and erased. Such a device 100 is in the form of a memory cell and includes transistor 102 having source 104 and drain 106 formed in a silicon body 108, source 104 and drain 106 being of a conductivity type opposite to that of the body 108, and having a channel region 110 formed therebetween. Gate insulation 112 electrically insulates a polycrystalline silicon floating gate 114 from channel region 110 and drain 106. Extending from the gate oxide 112 is a very thin tunnel oxide region 112A which electrically insulates a small portion of the floating gate 114 from the drain 106. This prior art structure further includes control gate 116 and insulation layer 118 formed between the floating gate 114 and control gate 116. Oxide isolation regions 117 are included on either side of the device 100.

As is well known, electrons can be injected into the floating gate 114 from the drain 106 by the tunneling of electrons through the thin tunnel oxide region 112A, upon application of appropriate voltages to the drain 106 and control gate 116. Likewise, electrons can be removed from the floating gate 114 through the thin tunnel oxide region 112A and into the drain 106 by application of other appropriate voltages to the control gate 116 and drain 106.

Several problems exist with this prior art device. First, with electrons passing through the thin tunnel oxide region 112A, a portion of which is an extension of the gate oxide 112, the gate oxide 112 is subject to receiving hot holes which cause degradation of the gate oxide, leading to early device breakdown. In addition, because the thin tunnel oxide 112A portion has a relatively long dimension A adjacent the drain 106 as shown in FIG. 1, the path of electrons through the thin tunnel oxide region 112A is not well focused, leading to a decrease in efficiency in erasing the device.

SUMMARY OF THE INVENTION

The present E²PROM device include a semiconductor body having source and drain and a channel region, with a gate oxide over the channel region and a floating gate over the gate oxide. An oxide isolation region is included, and has therewithin a doped polysilicon erase gate, so that erasing of the device takes place by electron flow from the floating gate to the erase gate through a thin oxide portion of the oxide insulation region. The inclusion of the erase gate of the oxide isolation region leads to reduced device size.

DESCRIPTION OF THE PREFERRED EMBODIMENTS

Figure 1:
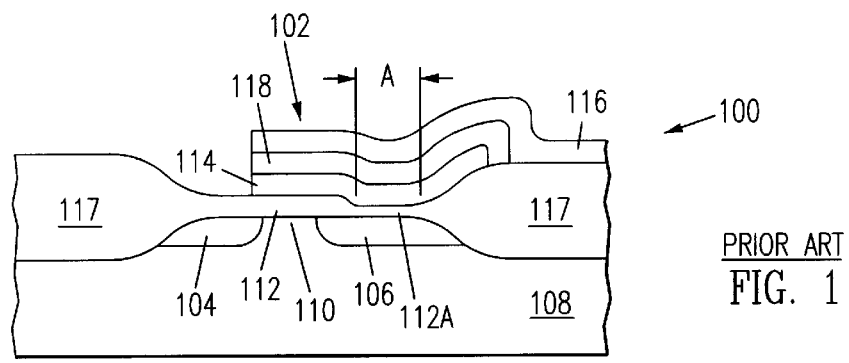
FIG. 1 is a sectional view showing a typical prior art E²PROM device.
Figure 2:
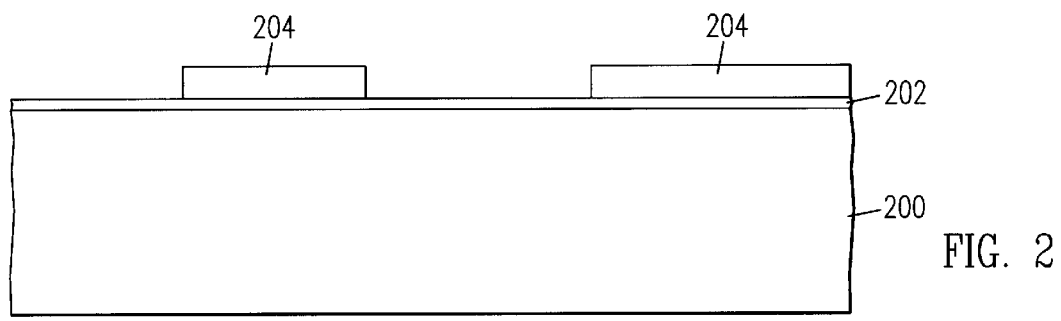
FIGS. 2–7 show process steps in fabricating the present inventive E²PROM device, with FIG. 7 showing a cross section of the inventive E²PROM device.
Figure 3:
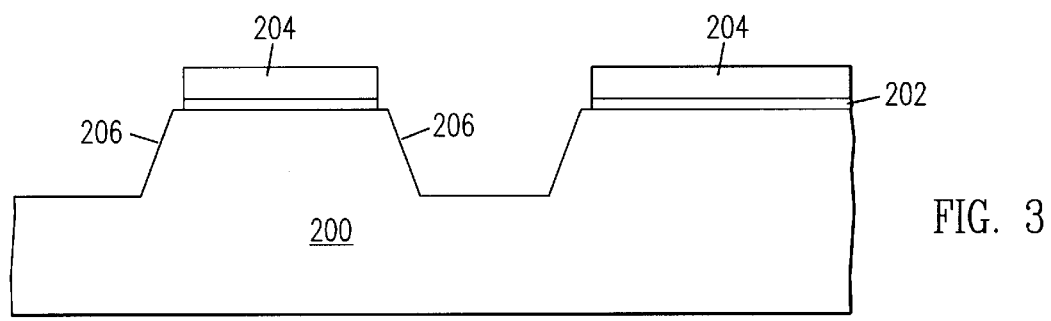

With reference to FIG. 2, a semiconductor body 200 is provided. A thin barrier oxide layer 202 (100–500Å) is grown at 800°–950° C. to serve as a barrier between nitride and body 200, and a patterned nitride layer 204 is provided over the oxide layer 202. The patterned nitride layer 204 (typically 300–3000 Å in thickness) acts as a mask for the etching of trenches 206 through the oxide layer 202 and into the semiconductor body 200 as shown in FIG. 3. The depth of the trench depends on the desired voltage to be used for the final product, typically 500–10,000 Å.

Figure 4:
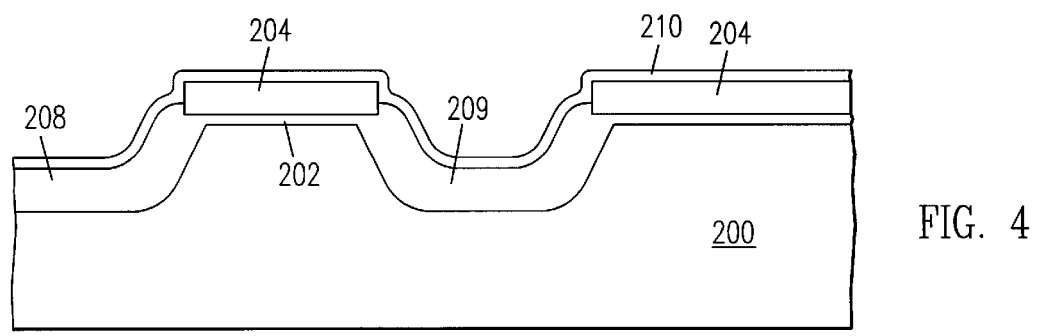

Next (FIG. 4), oxide portions 208, 209 are grown on the exposed portions of the silicon body 200 in the trenches 206 at desired temperature (typically 900°–1150° C.) to the desired thickness of 300–3000 Å for insulating purpose. Then, a thin layer of doped polysilicon 210 of desired thickness (200–3000 Å) is deposited over the resulting structure using LPCVD method at approximately 620° C. using $SiH_4$ gas (FIG. 4).

Figure 5:
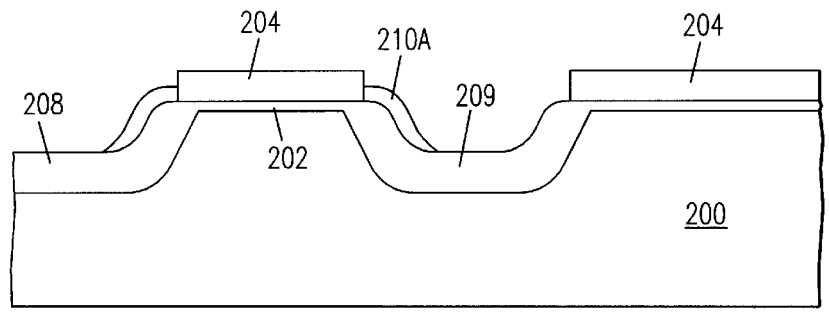

With reference to FIG. 5, the thin polysilicon layer 210 is then anisotropically etched using $SF_6+O_2$ chemistry, leaving a portion of the polysilicon layer 210A which will end up in the final device as an erase gate. A thick layer of CVD oxide 212, 213 (300–20,000 Å thick) is deposited and chemical mechanically polished (CMP) to form isolation oxide and act as a protection layer over the polysilicon portion during nitride strip.

The nitride layer 204 is then removed using phosphorus acid solution at approximately 150° C. The oxide isolation regions 214, 216 are formed, the oxide isolation region 216 made up of oxide portions 209, 213 containing the erase gate 210A. Then, source 218 and drain 220 of conductivity opposite to the conductivity of the silicon body 200 are provided as is well known.

The source 218 and drain 220 can be formed later in process steps after the formation of self-aligned stack gate if chosen.

Figure 6:
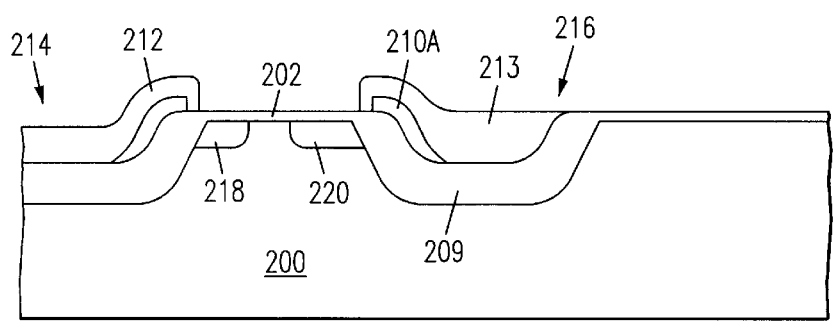

It will be noted that the erase gate 210A as shown in FIG. 6 is completely contained within oxide isolation region 216, so that the device size to be realized to less than that of the prior art.

Figure 7:
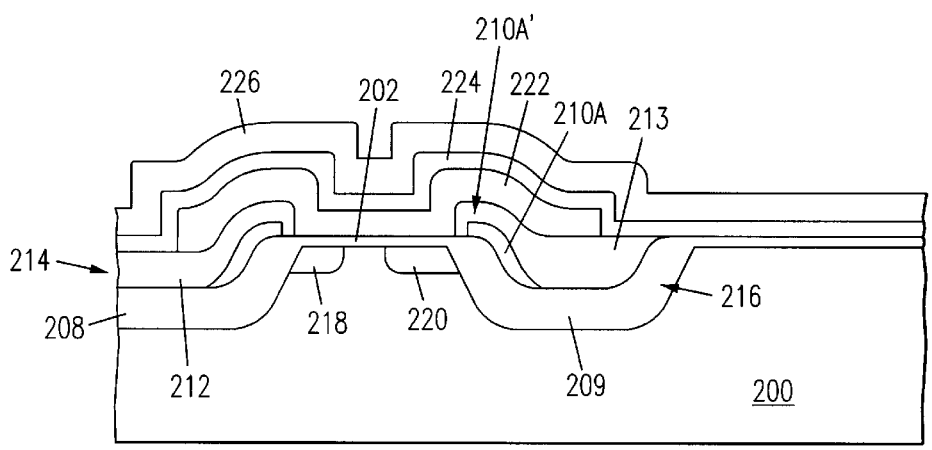

Next, a polysilicon floating gate 222 is provided over the resulting structure, formed to the configuration shown in FIG. 7 and overlying the erase gate 210A. Then, a thin insulating layer in the form of an oxide 224 is deposited over the resulting structure, and finally a polysilicon control gate 226 is provided over the oxide 224.

The device is programmed with channel hot electrons (CHE), i.e., hot electrons generated by properly based drain junction 220, passing through the oxide 202 and into the floating gate 222 by the application of appropriate voltages to control gate 226. However, during erasing of the device 200, i.e., removal of electrons from the floating gate 222, appropriate voltages are applied to the control gate 226 and erase gate 210A so that electrons pass through the area of the oxide 213 within the oxide isolation region 216, rather than through the gate oxide region 202. This avoids the problem of hot holes building up in and degrading the gate oxide 202. In addition, it will be seen that the area 210A, of the erase gate 210A into which electrons will flow has a pointed configuration adjacent the floating gate 222, providing for a well focused target for the electrons, resulting in a high efficiency in erasing the device.

We claim:

1. A horizontal E$^2$PROM device comprising:
    a semiconductor body having, at the upper surface of the semiconductor body, source and drain regions and a channel region;
    a gate oxide over the channel region;
    a floating gate over the gate oxide;
    an insulating layer over the floating gate;
    a control gate over the insulating layer;
    an oxide isolation region extending into the semiconductor body; and
    an erase gate enclosed within the oxide isolation region.

2. The device of claim 1 wherein the floating gate extends over the erase gate.

3. The device of claim 1 wherein the erase gate is doped polysilicon.

4. The device of claim 1 wherein a portion of the oxide isolation region is positioned between the erase gate and the floating gate.

5. The device of claim 4 wherein the erase gate has a substantially pointed portion most adjacent the floating gate.

6. A method of fabricating a horizontal E$^2$PROM device comprising:
    providing a semiconductor body;
    providing an oxide isolation region in the semiconductor body;
    providing an erase gate enclosed within the oxide isolation region;
    providing, near an upper surface of the semiconductor body, source and drain regions and a channel region in the semiconductor body;
    providing a gate oxide over the channel region;
    providing a floating gate over the gate oxide;
    providing an insulating layer over the floating gate; and
    providing a control gate over the insulating layer.

7. The method of claim 6 wherein the step of providing an oxide isolation region and an erase gate in the oxide isolation region comprise:
    growing a first oxide portion on the semiconductor body;
    providing a layer of doped polysilicon over the first oxide portion;
    anisotropically etching the doped polysilicon; and
    providing a second oxide portion over the first oxide portion, the first and second oxide portions together forming the oxide isolation region.

8. A method of fabricating an E$^2$PROM device comprising:
    providing a semiconductor body;
    providing an oxide layer over the semiconductor body;
    providing a patterned nitride layer over the oxide layer;
    etching through the oxide layer and into the semiconductor body using the patterned nitride layer as a mask, wherein a trench is formed in the semiconductor;
    growing a first oxide portion in the trench;
    depositing a doped polysilicon layer over the resulting structure;
    anisotropically etching the doped polysilicon layer to form an erase gate over a portion of the first oxide portion;
    removing the nitride layer;
    providing a second oxide portion over the first oxide portion, the first and second oxide portions forming an oxide isolation region containing the erase gate;
    providing source and drain regions and a channel region in the semiconductor body;
    providing a gate oxide over the channel region;
    providing a floating gate over the gate oxide;
    providing an insulating layer over the floating gate; and
    providing a control gate over the insulating layer.

* * * * *